United States Patent
Papa Rao et al.

(10) Patent No.: US 7,179,747 B2
(45) Date of Patent: Feb. 20, 2007

(54) USE OF SUPERCRITICAL FLUID FOR LOW EFFECTIVE DIELECTRIC CONSTANT METALLIZATION

(75) Inventors: Satyavolu S. Papa Rao, Garland, TX (US); Stephan Grunow, Dallas, TX (US); Phillip D. Matz, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 364 days.

(21) Appl. No.: 10/902,243

(22) Filed: Jul. 28, 2004

(65) Prior Publication Data

US 2005/0167841 A1   Aug. 4, 2005

Related U.S. Application Data

(60) Provisional application No. 60/542,243, filed on Feb. 4, 2004.

(51) Int. Cl.
  *H01L 21/311*  (2006.01)
  *H01L 21/302*  (2006.01)

(52) U.S. Cl. ............... 438/700; 438/745; 257/E21.002
(58) Field of Classification Search ............... 438/400, 438/421, 422, 689, 700, 745
  See application file for complete search history.

*Primary Examiner*—Scott B. Geyer
(74) *Attorney, Agent, or Firm*—Rose Alyssa Keagy; W. James Brady; Frederick J. Telecky, Jr.

(57) ABSTRACT

An embodiment of the invention is a method of manufacturing an integrated circuit. The method includes forming a capping layer of a back end structure (step 706), drilling an extraction line from the capping layer to an inter-metal dielectric layer (step 708), performing a supercritical fluid process to remove portions of the inter-metal dielectric layer that are coupled to the extraction line (step 710): thereby forming a denuded dielectric region. Another embodiment of the invention is an integrated circuit 2 having a back-end structure 5 coupled to a front-end structure 4. The back-end structure 5 having a first metal level 22. The first metal level 22 having metal interconnects 15 and an inter-metal dielectric layer 19. The back-end structure 5 further containing an extraction line 24 and a denuded dielectric region 25 coupled to the extraction line 24.

27 Claims, 12 Drawing Sheets

USE OF SUPERCRITICAL FLUID FOR LOW EFFECTIVE DIELECTRIC CONSTANT METALLIZATION

This application claims priority under 35 USC § 119(e)(1) of provisional application No. 60/542,243 filed Feb. 4, 2004.

BACKGROUND OF THE INVENTION

This invention relates to a low effective dielectric constant metallization scheme for integrated circuits.

DETAILED DESCRIPTION OF THE INVENTION

Figure 1:
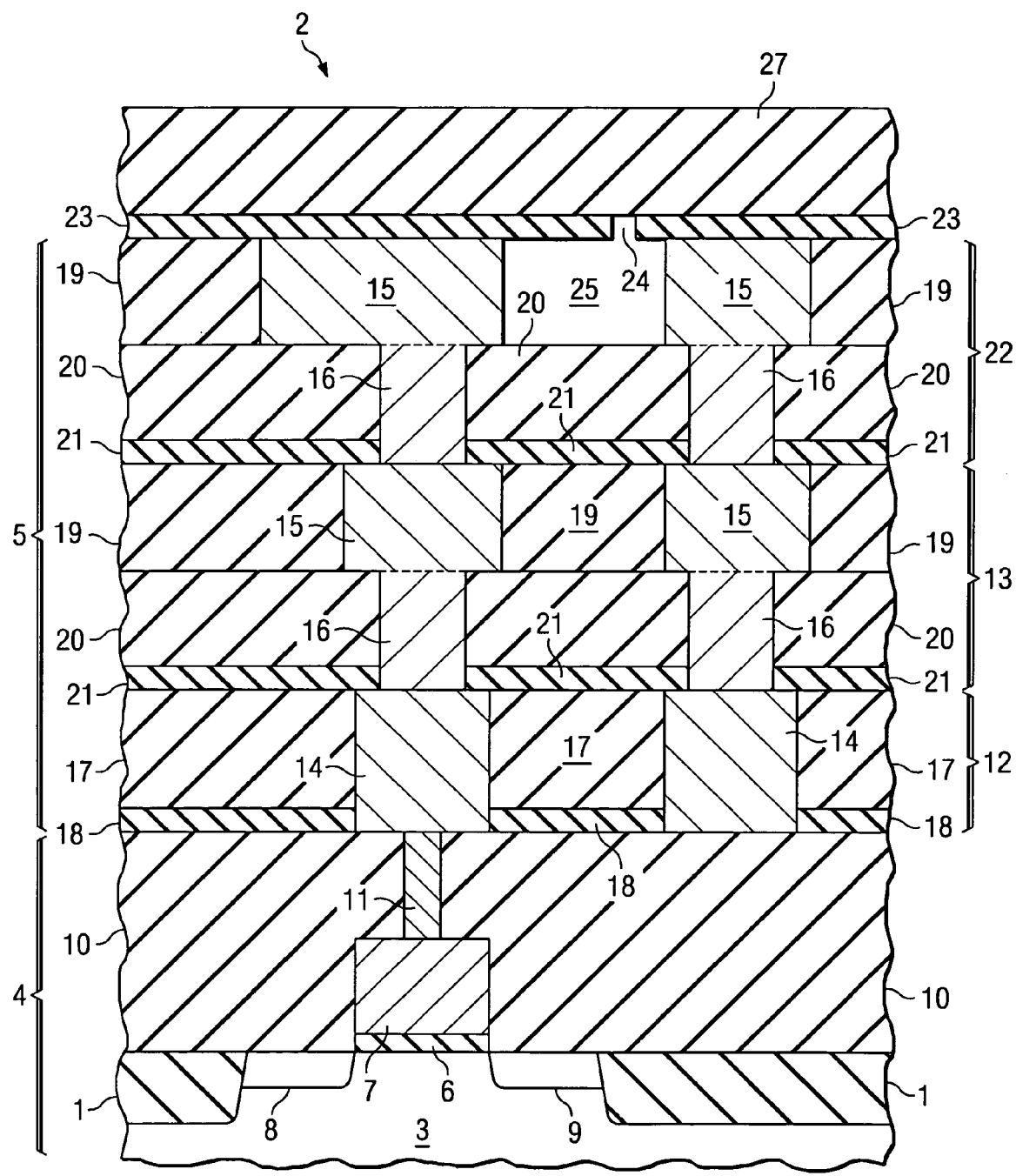
FIG. 1 is a cross-section view of an integrated circuit in accordance with a first embodiment of the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-section view of an integrated circuit 2 in accordance with a first embodiment of the present invention. An integrated circuit structure is commonly divided into two parts: the Front-End-Of-Line (FEOL) structure 4 and the Back-End-Of-Line (BEOL) structure 5. The structure that includes the silicon substrate 3 is called the FEOL structure 4 of the integrated circuit 2. In general, the FEOL 4 is the transistor layer formed on (and within) the semiconductor substrate 3. The example FEOL 4 shown in FIG. 1 includes a transistor having a gate oxide 6, gate electrode 7, and source/drain 8, 9. The semiconductor substrate 3 also contains regions 1 of electrical insulation (such as "Shallow Trench Isolation" structures). However, it is within the scope of the invention to have any form of logic within the FEOL structure 4.

Immediately above the transistor is a pre-metal dielectric layer ("PMD") 10 containing metal contacts 11 that electrically couple the transistor to the other logic elements (not shown) of the FEOL structure 4. As an example, pre-metal dielectric layer 10 may be comprised of $SiO_2$. In addition, contacts 11 may be comprised of W and may have barrier/adhesion liners comprised of materials such as Ti or TiN. However, it is within the scope of the invention to use other dielectric materials such as phosphorous doped silicate glass ("PSG"), carbon coped silicon oxides, or undoped silicon oxide for the PMD layer 10. Furthermore, other materials such as Ti or Al (with optional barrier/adhesion liners or nano-tube structures) may be used for contacts 11.

The example BEOL 5 contains a single damascene layer 12 and at least one dual damascene layer 13, 22. Layers 12, 13 and 22 contain metal interconnects 14, 15 that properly route electrical signals and power properly throughout the electronic device. Layers 13 and 22 also contain vias 16 that properly link the metal interconnects of one metal layer (e.g. the metal interconnects 14 of layer 12) to the metal interconnects of another metal layer (e.g. the metal interconnects 15 of layer 13).

The single damascene layer 12 contains metal interconnects 14 that are electrically insulated by inter-level dielectric layer ("ILD") material 17. As an example, the metal interconnects 14 may contain any metal such as copper. In addition, the ILD 17 may be any insulating dielectric material such as silicon dioxide, a doped oxide silicate such as fluorinated silicate glass ("FSG"), carbon-doped oxide ("CDO") which is also called organo-silicate glass ("OSG"), methylsilsesquioxane ("MSQ"), or hydrogen silsesquioxane ("HSQ"). However, it is also within the scope of the invention to use a silicon oxide material such as Tetraethyloxysilane ("TEOS"), fluorinated silica glass ("FSG"), or PSG for the ILD 17.

In addition, the single damascene layer 12 may have a thin dielectric layer 18 formed between the ILD 17 and the FEOL 4. It is within the scope of this invention to use any suitable material for the dielectric layer 18. For example, the thin dielectric layer 18 may comprise silicon carbide (SiC), silicon carbonitride (SiCN), silicon doped oxide (SiCO), or silicon nitride (SiN). The dielectric layer 18 may perform many functions. For example, it may function as a diffusion barrier layer by preventing copper that originates in metal interconnects 14 from diffusing to the silicon channel of the transistor or to another isolated metal interconnect (thereby creating an electrical short). Second, the dielectric layer 18 may function as an etch-stop when manufacturing the metal interconnects 14 within the ILD 17. Lastly, the dielectric layer 18 may function as an adhesion layer to help hold the layer of OSG 17 to the FEOL 4 or to the dual damascene layer 13. For purposes of readability, the thin dielectric layer 18 will be called the etch-stop layer 18 during the rest of the description of this invention.

Dual damascene layers 13 and 22 contain metal interconnects 15 that are electrically insulated by inter-metal dielectric layer ("IMD") material 19. Dual damascene layers 13 and 22 also contain vias 16 that are electrically insulated by ILD 20. The metal interconnects 15 and vias 16 may contain any metal such as copper, plus a barrier/adhesion liner if needed. However, the use of other materials such as alloys of aluminum, alloys of copper, alloys of silver or any combination thereof are within the scope of this invention.

In accordance with the best mode of the invention, the IMD 19 is a silicon oxide material such as TEOS; however other insulative materials such as FSG or PSG may be used. Also in accordance with the best mode of the invention, the ILD 20 may be any insulating dielectric material such as silicon dioxide, FSG, CDO, MSQ, or HSQ.

Like the single damascene layer 12, the dual damascene layers 13, 22 may also contain a dielectric layer 21 that serves as a via etch-stop layer during manufacturing. Any suitable dielectric material, such as SiC, SiCN, SiCO, or SiN may be used as the via etch-stop layer 21.

A capping layer 23 is located over the top dual damascene layer 22. In the example application, the capping layer 23 is comprised of SiCN; however other materials such as SiN or SiC may be used. In the example application, a non-conformal top layer 27 is located over the capping layer 23; protecting the integrated circuit 2 from the environment. The non-conformal top layer 27 may be comprised of any suitable material that provides an oxygen and moisture barrier, such as a thick layer of $SiO_2$ (i.e. TEOS) or SiN.

In accordance with the best mode of the first embodiment of the present invention, shown in FIG. 1, an extraction line 24 is located in the capping layer 23. In addition, a denuded dielectric region 25 is located adjacent to the extraction line 24.

Figure 2:
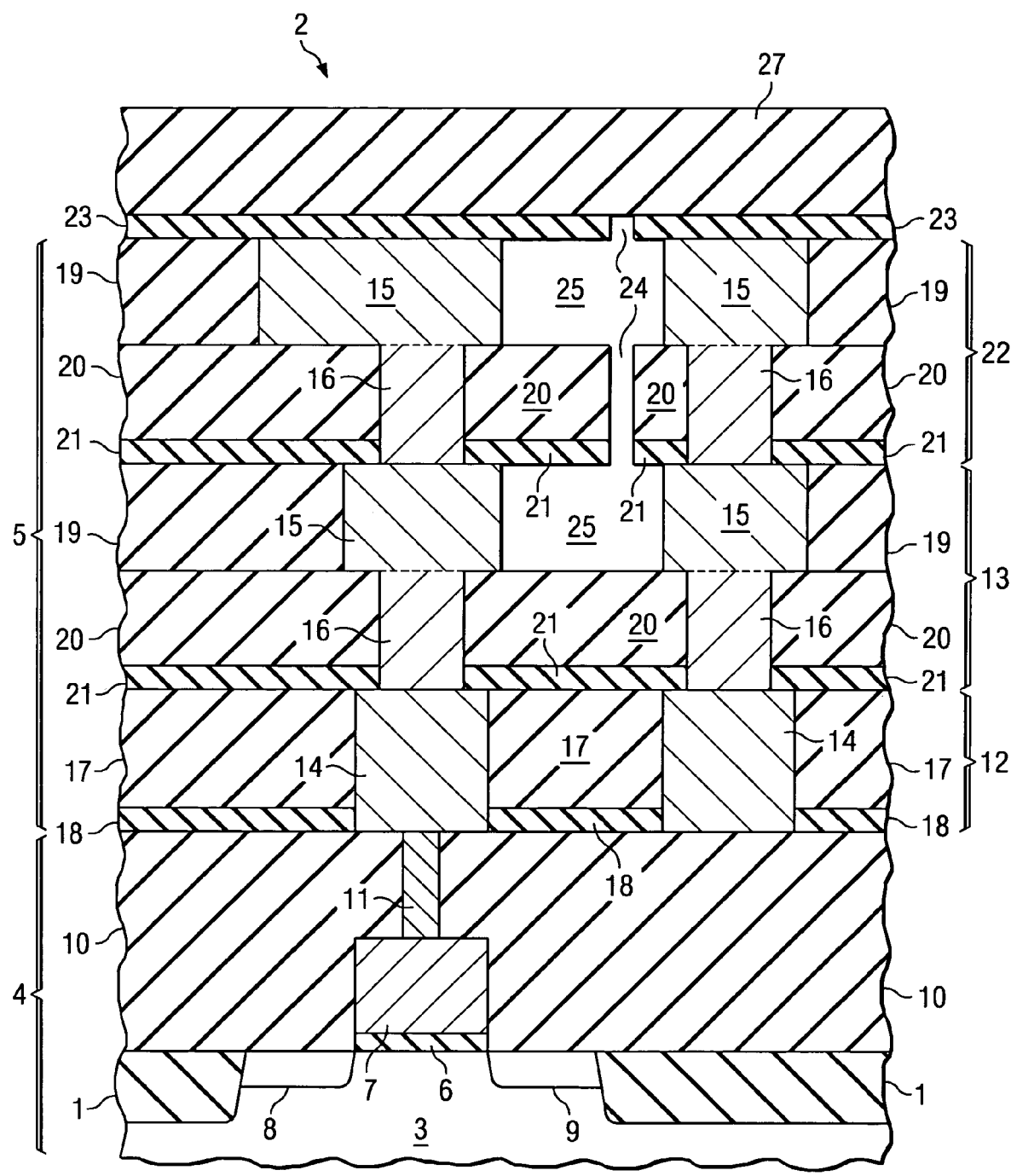
FIG. 2 is a cross-section view of an integrated circuit in accordance with a second embodiment of the present invention.

In accordance with the best mode of a second embodiment of the present invention, shown in FIG. 2, the extraction line 24 extends through the dual damascene layer 22 (e.g. through ILD 20 and etch-step 21) to at least one additional dual damascene layer 13. In this example, there is a denuded dielectric region 25 adjacent to the extraction line 24 in each dual damascene layer 13, 22.

Figure 3:
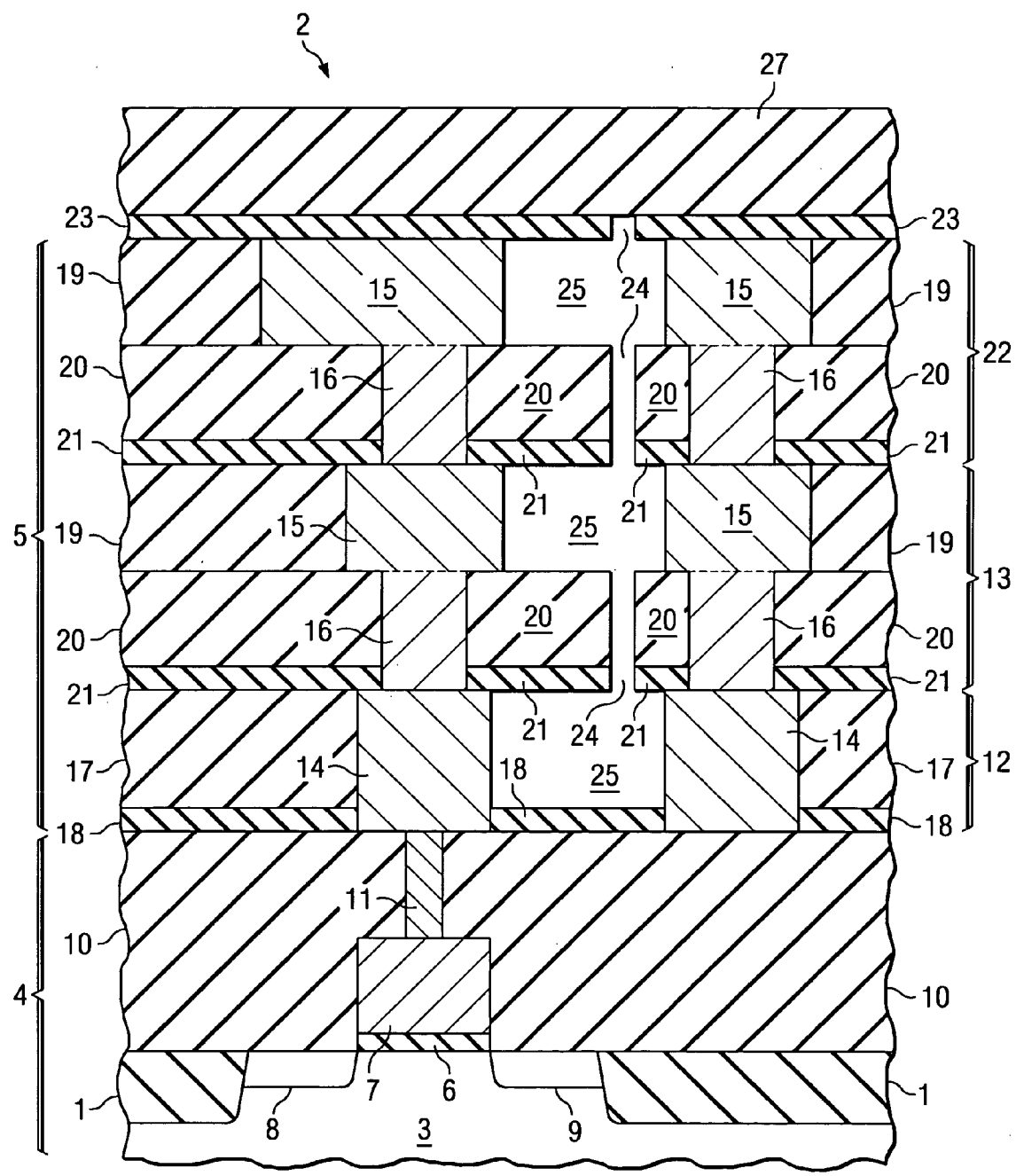
FIG. 3 is a cross-section view of an integrated circuit in accordance with a third embodiment of the present invention.

In accordance with the best mode of a third embodiment of the present invention, shown in FIG. 3, the extraction line 24 extends through all dual damascene layers 13, 22 to the single damascene layer 12. In this example, there is a denuded dielectric region 25 adjacent to the extraction line 24 in each dual damascene layer 13, 22 and the single damascene layer 12.

Figure 4:
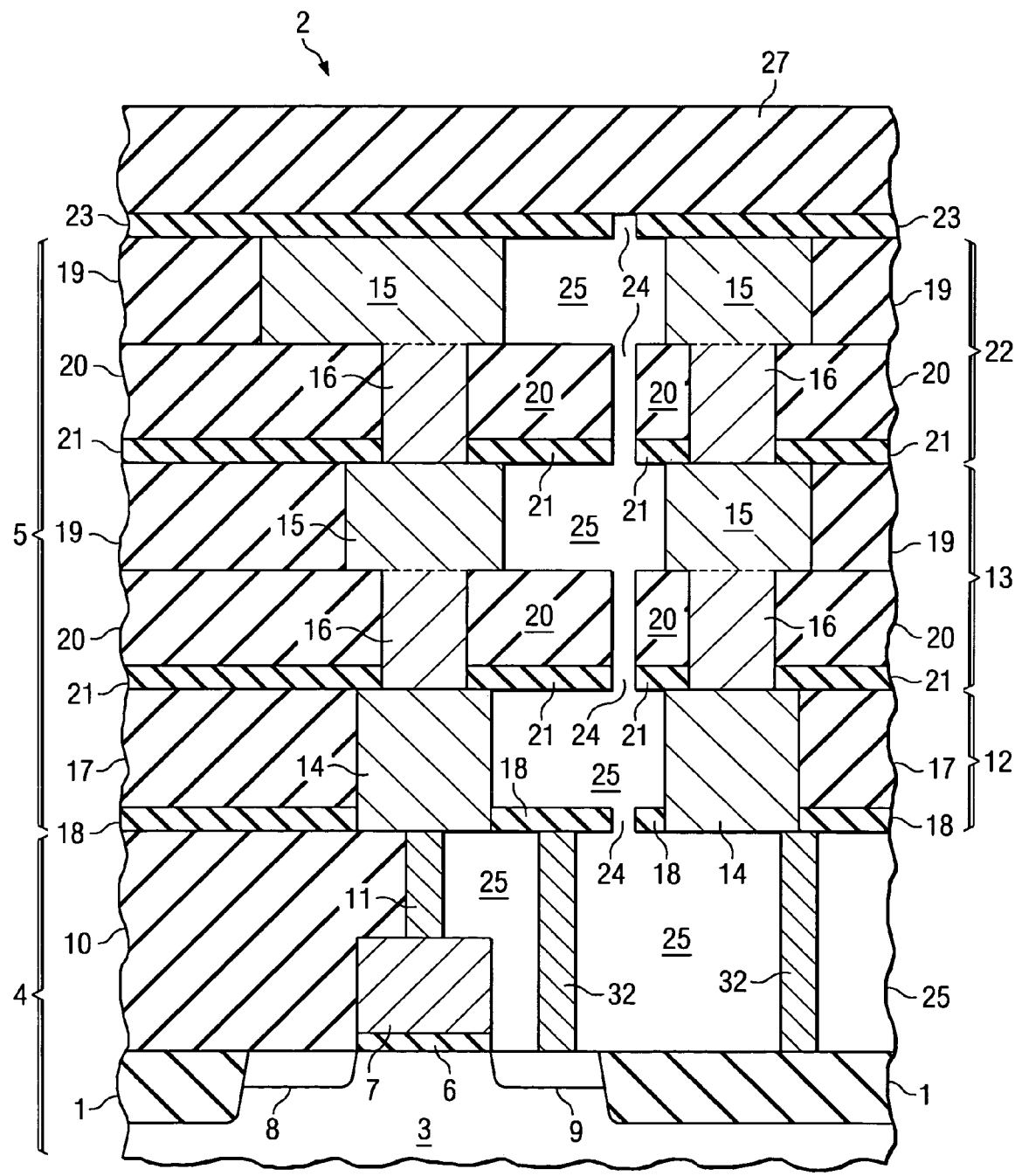
FIG. 4 is a cross-section view of an integrated circuit in accordance with a fourth embodiment of the present invention.

In accordance with the best mode of a fourth embodiment of the present invention, shown in FIG. 4, the extraction line 24 extends through all dual damascene layers 13, 22 and the single damascene layer 12 to the PMD 10. In this example, there is a denuded dielectric region 25 adjacent to the extraction line 24 in each dual damascene layer 13, 22, the single damascene layer 12, and the PMD layer 10. In this example, dummy plugs 32 are added during the fabrication of the PMD layer 10 to improve the strength and stability of the denuded region 25 in the PMD layer. It is to be noted that the dummy plugs 32 do not prevent the denuding of the dielectric 10 from all around the dummy plugs, as described more fully below. The dummy plugs 32 may be comprised of any material, such as copper, aluminum, or a combination thereof (i.e. copper within the PMD layer and aluminum within the ILD and IMD layers).

Figure 5:
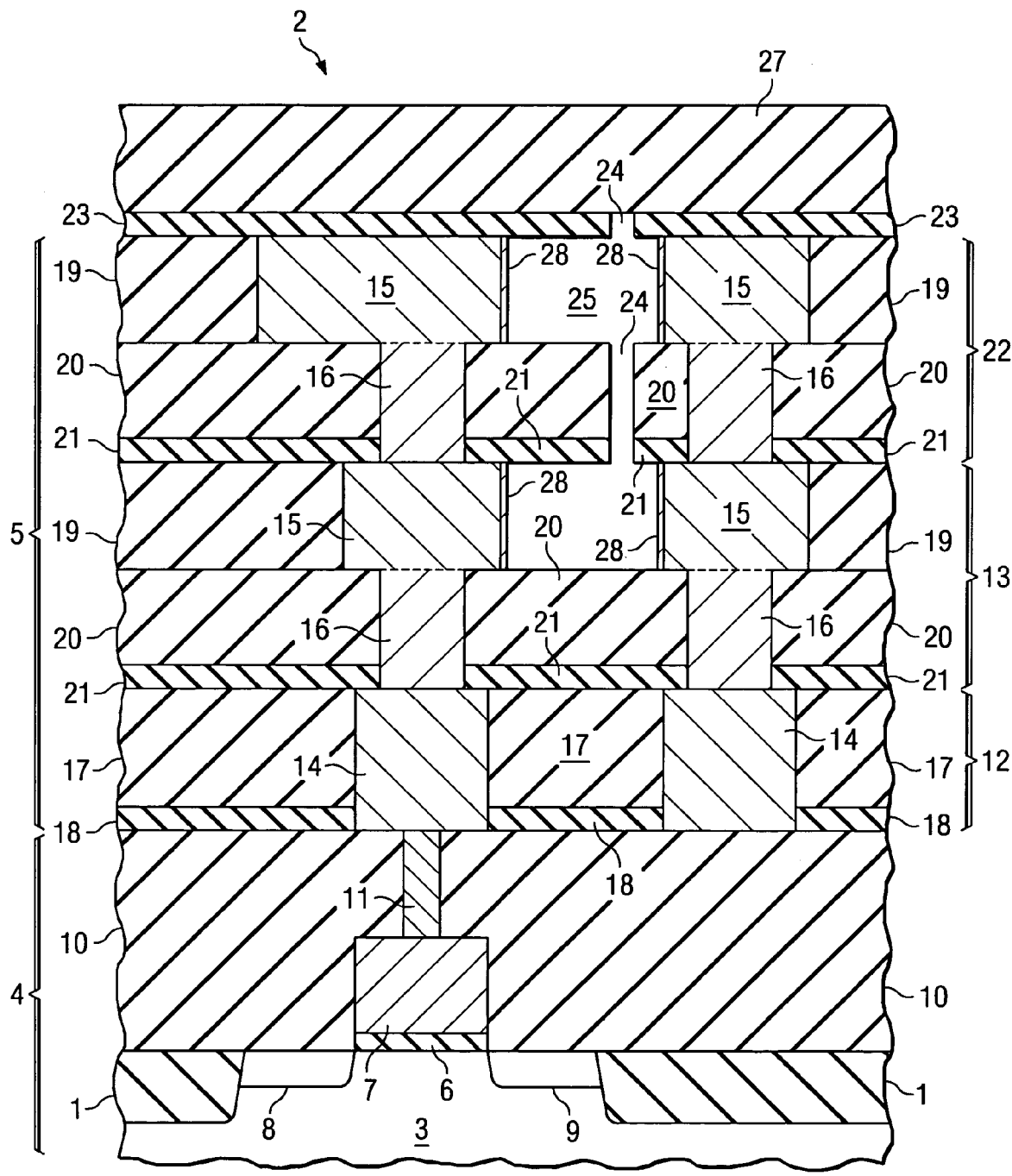
FIG. 5 is a cross-section view of an integrated circuit in accordance with a fifth embodiment of the present invention.
Figure 6:
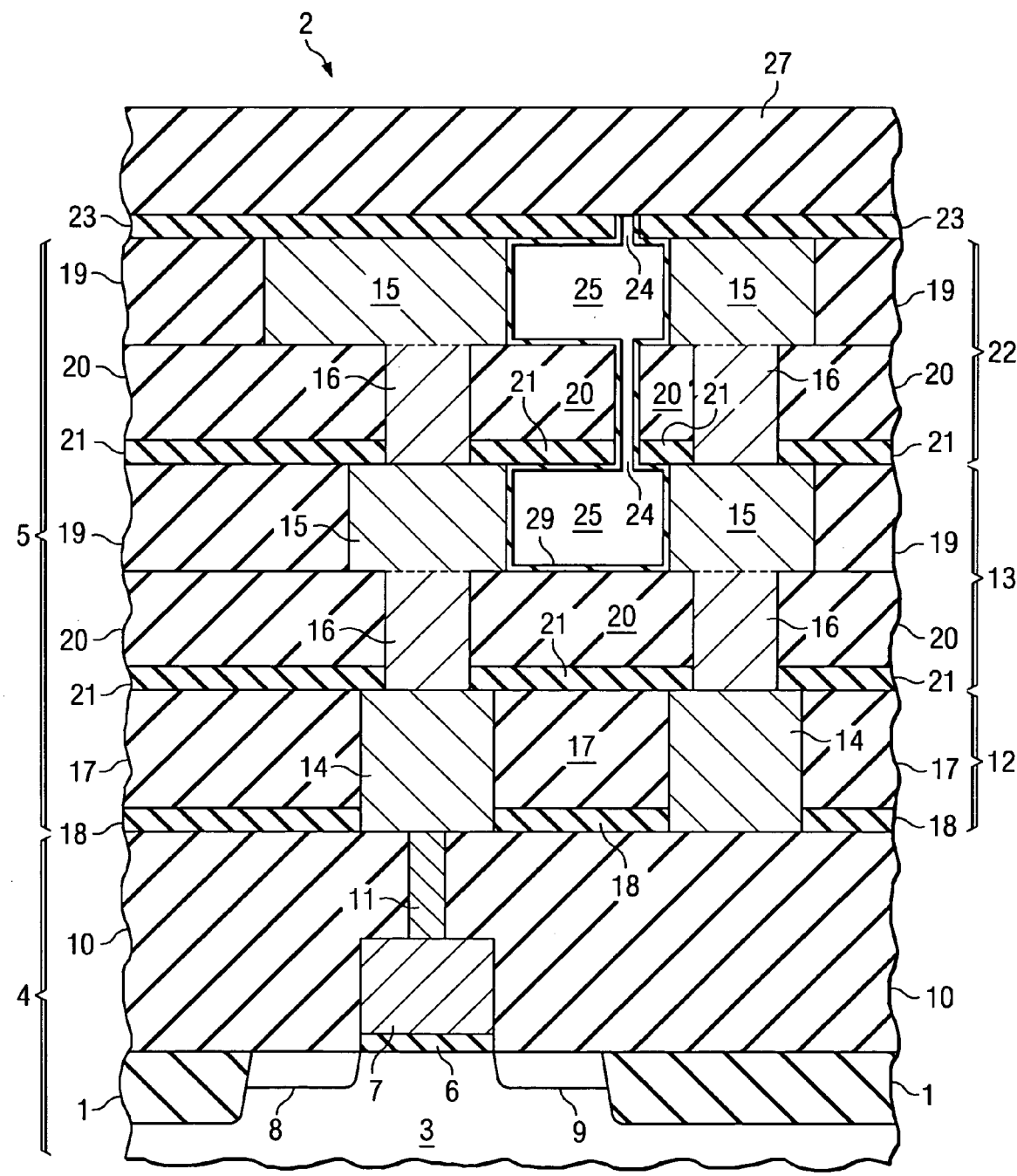
FIG. 6 is a cross-section view of an integrated circuit in accordance with a sixth embodiment of the present invention.

The denuded dielectric regions 25 of FIGS. 1–4 may contain air. However, it is within the scope of the invention to have the denuded dielectric regions 25 back-filled with an inert gas (such as $N_2$, Ar, He, Xe, or Ne), another dielectric material (such as a low-k dielectric or an ultra low-k dielectric), a selective and conformal metal film 28 as shown in FIG. 5 or a conformal bolster film 29 as shown in FIG. 6. The conformal metal film 28 may comprise any suitable material such as Ta or W; and the conformal bolster film 29 may comprise any suitable material such as SiN or diamond-like carbon ("DLC")

Figure 7:
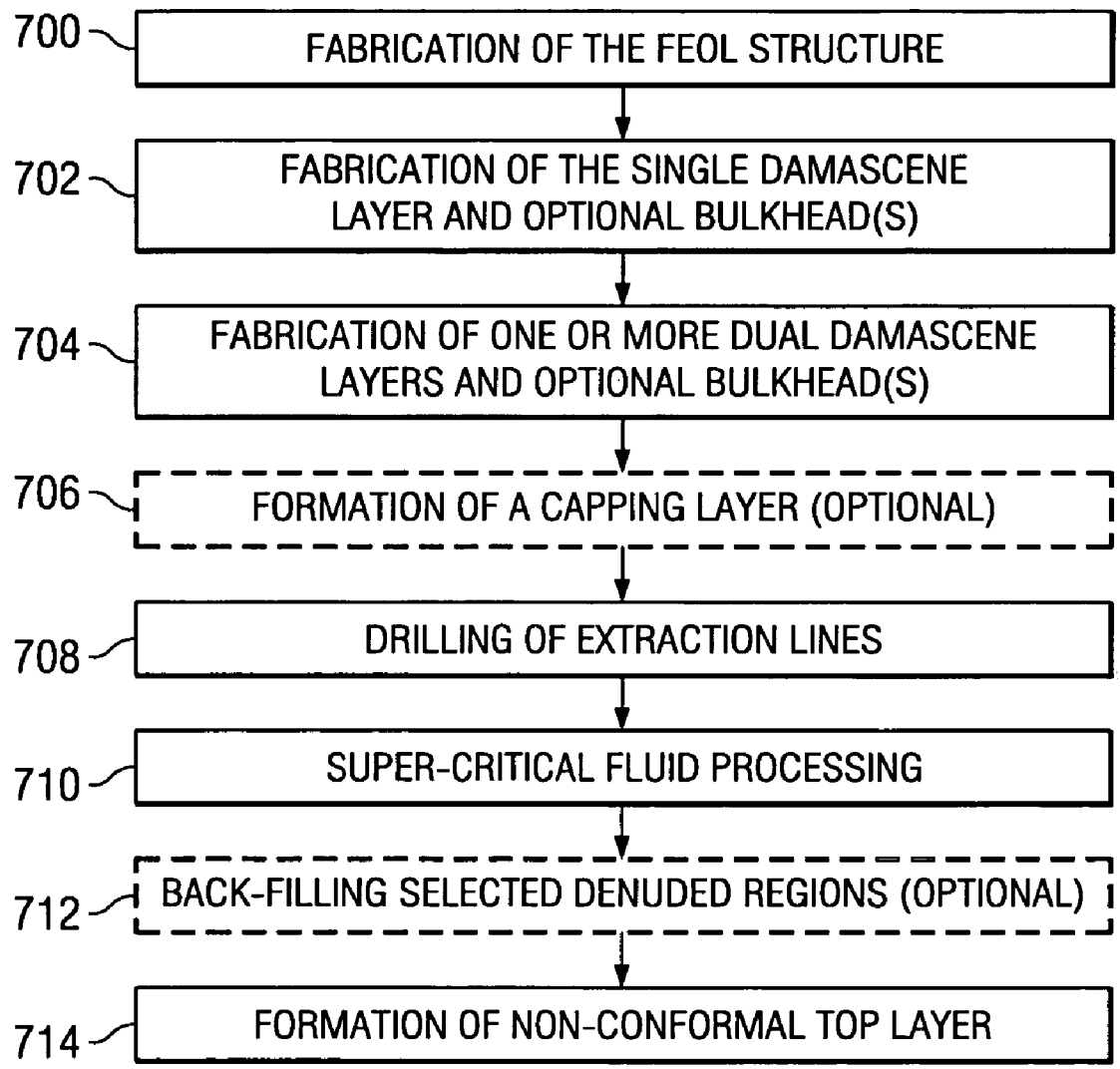
FIG. 7 is a flow chart illustrating the process flow of the present invention.

FIG. 7 is a flow diagram illustrating the process flow of the present invention. Other than process steps 706–712, and possibly 714, the process steps for manufacturing the integrated circuit 2 are those standard in the industry.

The present invention may be used in any integrated circuit configuration; therefore, the first step (step 700) is to fabricate the FEOL 4 to create any logic elements necessary to perform the desired integrated circuit function. In general the fabrication of the FEOL 4 begins by forming the passive and active elements, such as the transistor shown in FIG. 1, within the semiconductor substrate 3. A layer of PMD 10 is formed over the entire substrate and then patterned and etched to form openings for contacts 11 which extend to the passive and active elements, as well as the substrate 3. These openings are then filled with metal material, thereby forming the final contact structures 11.

Next, in step 702, the single damascene layer 12 of the BEOL 5 is fabricated over the FEOL 4. In general, the fabrication of the BEOL 5 starts with the formation of the etch-stop layer 18 using any suitable manufacturing process such as Plasma-Enhanced Chemical Vapor Deposition ("PECVD"). However, the use of an etch-stop layer 18 is optional.

Next, a layer of ILD 17 is formed over the entire substrate. The ILD 17 may be applied to the semiconductor substrate with any suitable process such as Chemical Vapor Deposition ("CVD").

If portions of the ILD 17 are to be eventually removed, then the ILD 17 is comprised of a material that can be removed later in the fabrication process—namely with an etch process that uses supercritical fluid ("SCF"), as described below. Examples of such materials are TEOS, FSG, and PSG. The supercritical fluid process that is used to remove these ILD materials will often incorporate co-solvents such as alcohols, water, and/or hexane, plus an active etch species such as HF, pyridine:HF, and/or ammonium fluoride.

Conversely, if portions of the ILD 17 are not to be removed later in the fabrication process, then the ILD 17 material is intrinsically designed to be non-soluble in SCF and unreactive to the co-solvents involved in the SCF process. The SCF process used (step 710) must be tuned with the appropriate co-solvents and active etchant species in order to enable the desired etch selectivity towards materials targeted for dissolution/extraction but leave the rest of the integrated circuit 2 unharmed.

The optional etch-stop layer 18 and the ILD 17 are then patterned (using photoresist and photolithography) to form holes for the metal interconnects 14. Holes may also be formed for optional structures such as dummy plugs 32 or bulkhead structures 41 (which are described more fully below). A layer of metal material is formed over the substrate and then polished to from the metal interconnect structures 14 plus any of the optional dummy plugs 32 and/or bulkhead structures 41. In the example application, a Chemical Mechanical Polish ("CMP") process is used to form the metal interconnects 14; however, other manufacturing processes may be used to form the metal interconnects 14.

In step 704, the fabrication of the BEOL 5 continues with the formation of one or more dual damascene layers 13, 22. The fabrication of a dual damascene layer generally begins with the formation of an etch-stop layer 21 over the entire substrate. The etch-stop layer 21 may be formed using any suitable manufacturing process such as PECVD. Next a low-k ILD layer 20 is formed over the entire substrate. The ILD layer 20 may be formed using any suitable manufacturing process such as CVD. In the best mode application, ILD 20 is comprised of HSQ. However, it is within the scope of the invention to use other materials for the ILD 20. For example, other carbon-doped oxides that are not soluble in supercritical fluid and have desirable electrical properties (i.e. low leakage and good mechanical strength) may be used for the ILD 20.

Figure 8:
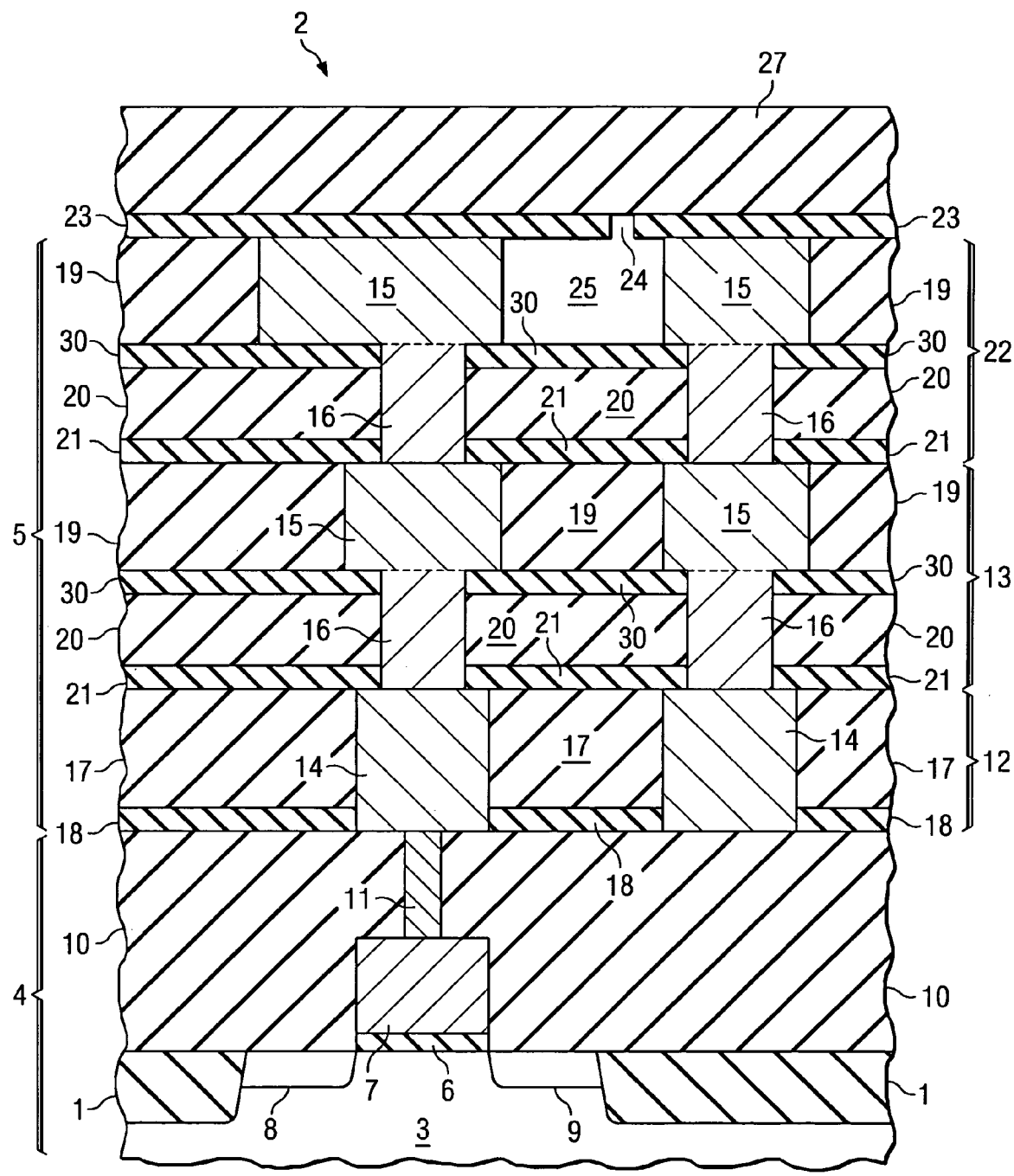
FIG. 8 is a cross-section view of an integrated circuit in accordance with a seventh embodiment of the present invention.

At this point, an optional trench etch-stop layer 30 may be formed. If used, the trench etch-stop layer will facilitate the proper formation of the metal interconnects 15. An example integrated circuit 2 having trench etch-stop layers 30 is shown in FIG. 8. The trench etch-stop layer 30 may be the same low-k material that was used for the etch-stop layers 18 and 21, or a different dielectric material may be used.

Next, a low-k IMD layer 19 is formed over the entire semiconductor substrate. Preferably, the IMD layer 19 is formed using a PECVD process; however, any suitable process may be used. In the best mode application, the IMD layer 19 is comprised of TEOS. However, it is within the scope of the invention to use other materials for IMD 19. For example, any $SiO_2$ material that is soluble in supercritical fluid and has desirable physical characteristics (i.e. inexpensive, easy to manufacture, hard, and resistant to moisture absorption) may be used for the IMD layer 19—such as FSG or PSG.

A temporary cap layer (not shown) is usually formed over the substrate at this point in the manufacturing process to ensure proper formation of the metal interconnects 15 and vias 16. In an example application called the "via first" process, the holes for the vias (plus any optional dummy plugs 32 and bulkhead structures 41) are formed first using photolithography and etch techniques. Then the holes for the metal interconnects or "trenches" 15 (and optional dummy plugs 32 and bulkhead structures 41) are formed using photolithography and etch techniques. Next, a metal layer is formed over the entire substrate. After a CMP, the metal interconnects 15 and vias 16 are complete (as well as any of the optional dummy plugs 32 and bulkhead structures 41).

If a "trench first" process is performed, then the holes for the metal interconnects 15 (plus optional bulkhead structures 41 and dummy plugs 32) are formed first (possibly using the optional trench etch-stop layer 30 to control trench depth). Then the holes for the vias (and any optional bulkhead structures 41 and dummy plugs 32) are formed. A metal layer is then formed over the entire substrate, and after a CMP the metal interconnects 15 and vias 16 are complete (as well as any of the optional dummy plugs 32 and bulkhead structures 41).

Figure 9:
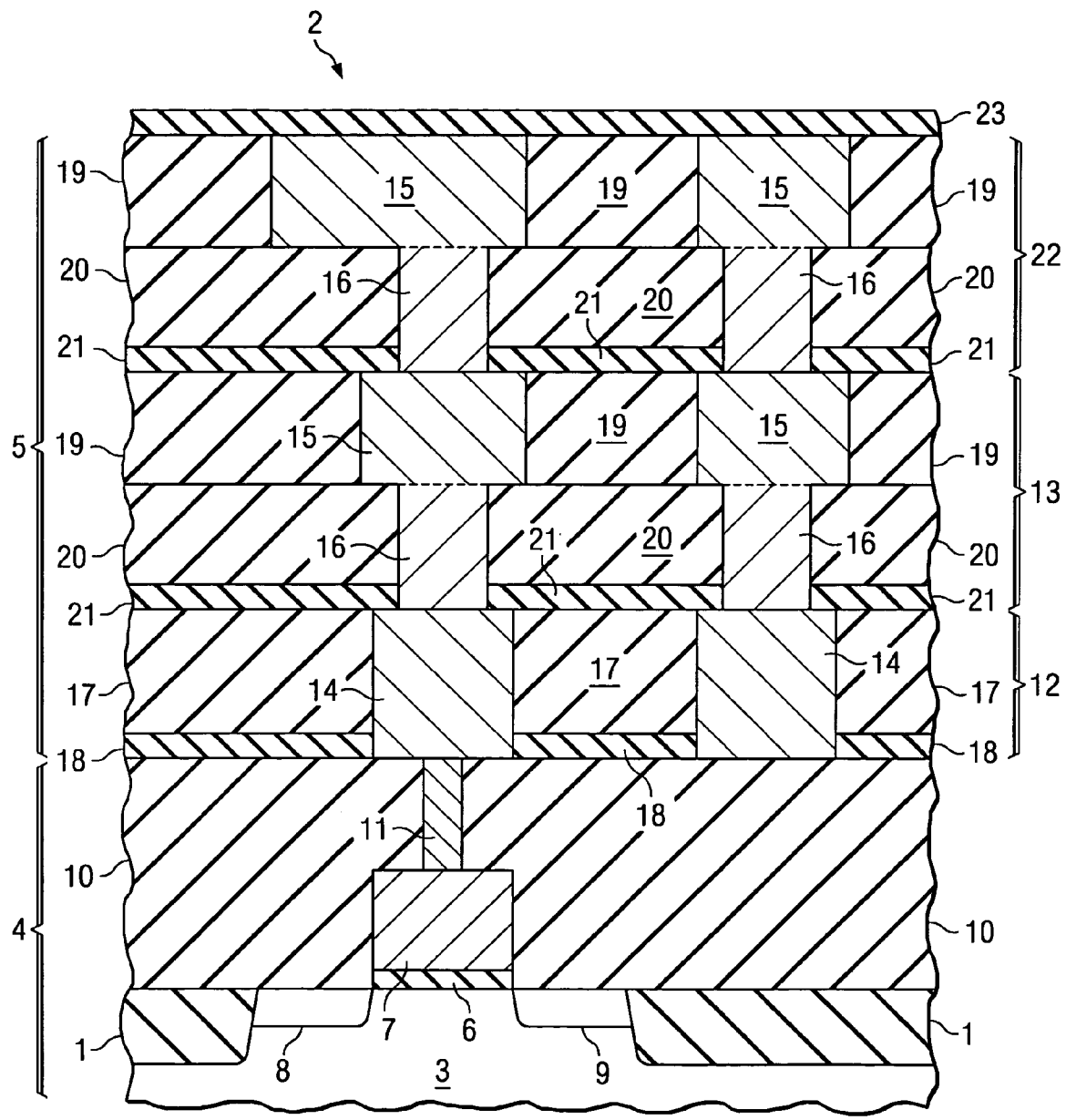
FIG. 9 is cross-sectional diagram of a partially fabricated integrated circuit in accordance with the present invention.

At this point, one or more additional dual damascene layers (step 704) may be fabricated using a similar fabrication process. After the final dual damascene layer is complete, a capping layer 23 is formed over the entire substrate (step 706). In the best mode application, the capping layer 23 is comprised of SiCN or SiN. Any suitable manufacturing technique, such as PECVD, may be used to form the capping layer 23. The structure of the integrated circuit 2 at this point in the manufacturing process is shown in FIG. 9.

Figure 10:
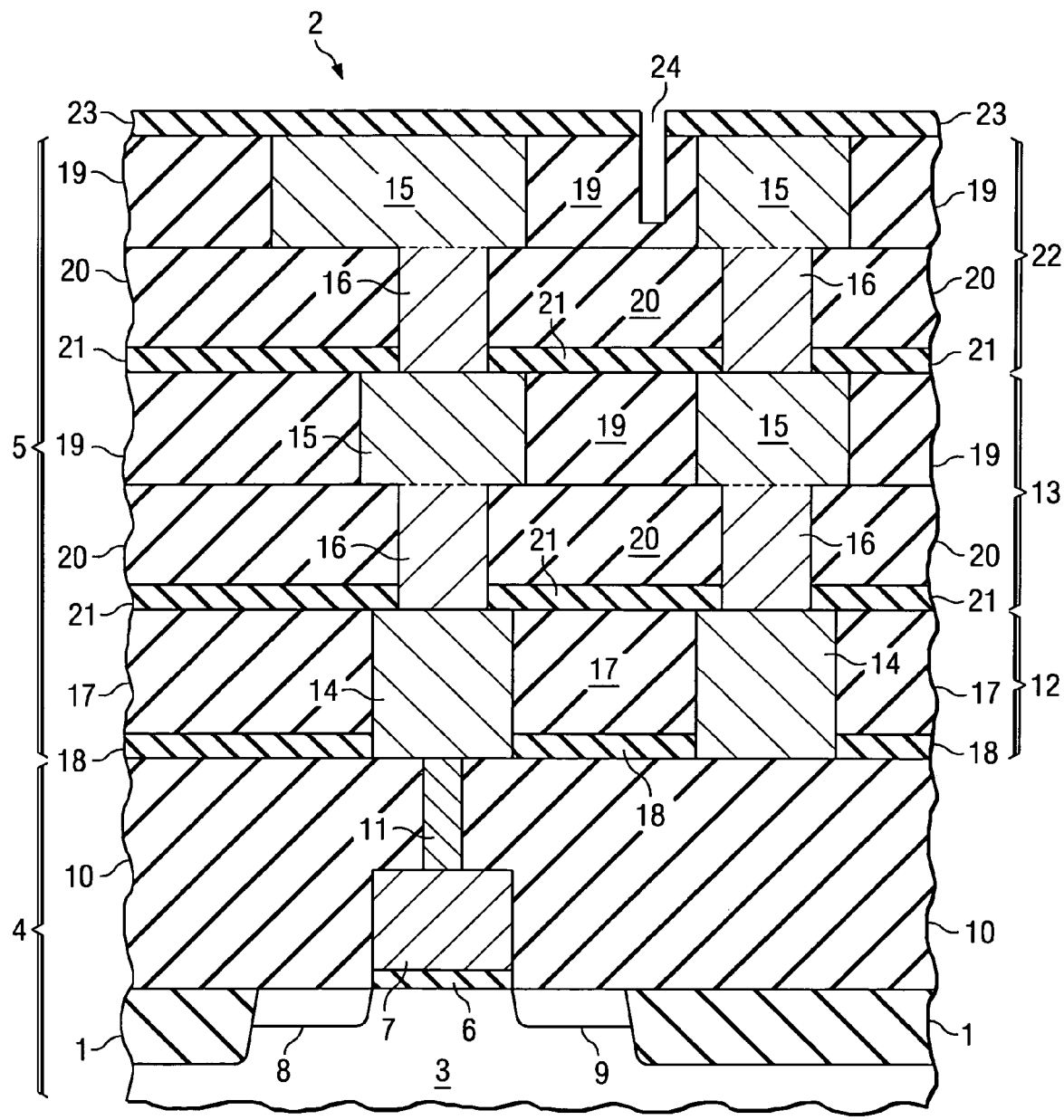
FIG. 10 is cross-sectional diagram of a partially fabricated integrated circuit in accordance with the present invention.

In an example application, shown in FIG. 10, an extraction line 24 is drilled through the capping layer 23 into a selected region of IMD 19 of dual damascene layer 22 (step 708). In the best mode application, the extraction line 24 is created by using a fluorocarbon-based plasma etch (a "RIE" process). After a post-etch clean of the semiconductor substrate, the substrate is placed in a supercritical fluid chamber for the denuding of the selected region or regions of IMD 19 (step 710).

The denuding process is performed in a high pressure supercritical fluid chamber manufactured by TEL (Tokyo Electric Company). In the best mode application, the process is a high-pressure, low temperature, supercritical $CO_2$ ("$scCO_2$") process. The process parameters are those that are typically used to maintain the $CO_2$, plus the co-solvents (i.e. alcohols such as methanol) and the active etchant (i.e. HF), in a supercritical fluid state. In an example application, the system operating pressure is above 1600 psi, the temperature is above 50° C., and the solvent is carbon dioxide between 60–95 volume percent. In addition, the typical concentrations of co-solvents may be 0–30% alcohol (by volume), 0–10% water, and 0–2% etchant (i.e. fluoride-based acid). The supercritical fluid characteristics of $scCO_2$ (i.e. low viscosity and surface tension) cause the solution to facilitate a rapid and effective etching and dissolution of the IMD—without harming the capping layer 23, the metal interconnects 15, or the ILD 20.

It is to be noted that the chemical nature of the solution can be modulated by varying the additives. The SCF described above will enable the mobility of the active species and facilitate the removal of the reaction byproducts within a favorable time scale. The result of this $scCO_2$ process is the denuded dielectric region 25, shown in FIGS. 1–4.

It is within the scope of the invention to modify the present invention in order to customize the integrated circuit structure 2. For example, the location of denuded regions may be controlled through the placement and depth of extraction lines 24. Thus, the IMD regions in more than one dual damascene layer 13, 22 may be denuded, as shown in FIG. 2. In addition, if the material used to form ILD layers (20 or 17) is soluble in $scCO_2$, then any desired ILD region may also be denuded, as shown in FIG. 3. Furthermore, if the material used to form the PMD layer 10 is soluble in $scCO_2$, then any desired PMD region may be denuded, as shown in FIG. 4. However, if mechanical strength is needed in targeted regions then dielectric materials which are not soluble in $scCO_2$ (and therefore cannot be denuded) are used to form those PMD, ILD, IMD, or etch-stop layers that are to be protected.

The structure of the integrated circuit 2 can be further customized through the use of bulkheads 41. In the example application shown in FIG. 11, bulkheads 41 may be placed in portions of the integrated circuit 2 where the bonding pads 42 are located. The bulkhead structures 41 will provide strength to the integrated circuit 2 during the potentially high mechanical force of the wiring process. This added strength will be provided by the bulkhead structures 41 as well as the dielectric (i.e. 10, 17, 19) which will remain between the bulkhead structures (which protect those dielectric regions from the denuding process). In this example, the wiring 46 is laid out such that the bond pad 42 is coupled to a deep n-well 44 within substrate 3 in order to get the electrical signals in to and out of the bulkhead 41 region.

Figure 11:
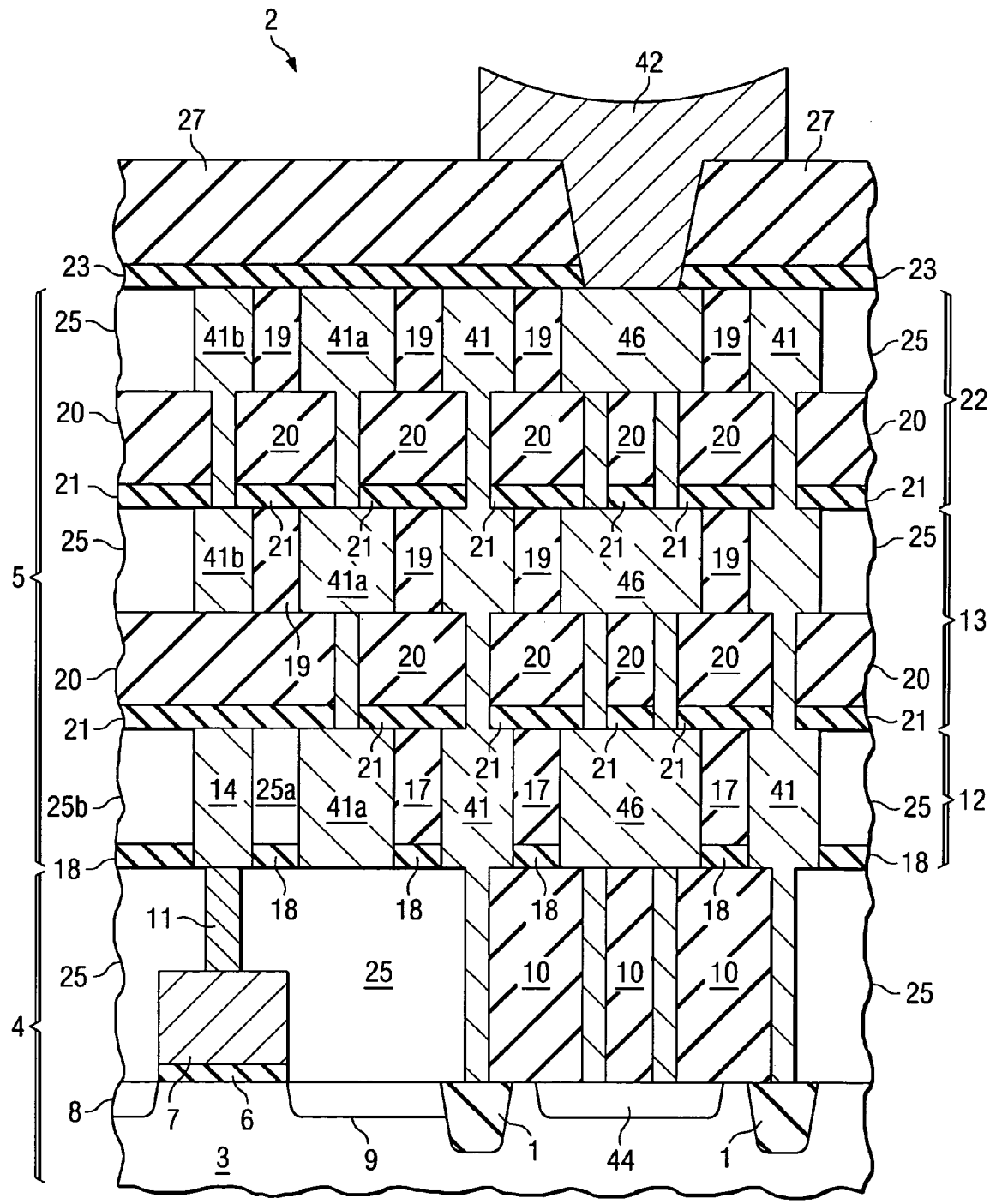
FIG. 11 is a cross-section view of an integrated circuit in accordance with a eighth embodiment of the present invention.

Moreover, bulkhead structures 41 may be used anywhere within the integrated circuit 2 to protect selected portions of the integrated circuit 2 from the denuding process. For example, FIG. 11 shows a bulkhead structure 41a that protects the dielectric in layers 12, 13, and 22 that is located between the bulkhead 41a and the adjacent bulkhead 41. In addition, the bulkhead structure 41b protects the dielectric that is present between it and the bulkhead 41a (only in layers 13 and 22). Of course, the bulkhead structures need to be a closed structure within at least one layer (10, 12, 13, 22) of the circuit in order to effectively block the flow of SCF and thereby protect the enclosed dielectric material from being denuded. The bulkheads 41, 41a, 41b, may be comprised of any material, such as copper or aluminum.

It is to be noted that the extraction line for the integrated circuit 2 of FIG. 11 (which in this example extends all the way to the PMD layer 10 but is not shown) will likely enable the $scCO_2$ process to denude large regions of dielectric within the chosen layers 12, 13, 22. For example, regions 25a and 25b are both denuded because in another location of the single damascene layer 12 (not shown) the metal interconnect 14 ended and therefore allowed the $scCO_2$ solution to continue with the denuding of the dielectric of layer 12 (i.e. the solution traveled from region 25a around interconnect 14 to 25b, denuding all of the dielectric 17 that was located in regions 25a and 25b). Similarly, the $scCO_2$ solution will denude the dielectric which surrounds any optional dummy plug 32, as shown in FIG. 4.

It is also within the scope of the invention to back-fill any desired denuded region 25 (optional step 712). For example, a similar $scCO_2$ process (or another process such as CVD) could be used to place a different carbon doped oxide, carbon-doped silicate, low-k dielectric, or ultra low-k dielectric material (such as OSG) within the desired denuded regions 25. In addition, the denuded regions could be back-filled with an inert gas such as Ar or $N_2$ during a subsequent processing step, as described below.

Furthermore, selected denuded regions 25 could be back-filled with a conformal metal film 25, as shown in FIG. 5. For example, a selective surface-activated process (such as electro-less deposition, CVD, or Atomic Layer Deposition ("ALD")) could be used to deposit additional barrier layers selectively on any pre-existing barrier metal (i.e. Ta, ALD-TaN, Ru, etc.) that is located on metal interconnects 14, 15. As another example, an ALD layer (i.e. ALD-TaN) may be formed such that it is conductive when deposited over the pre-existing metallic barrier layer but acts as a dielectric when deposited over a dielectric film. Similarly, a bolster film 29 could be formed within selected denuded regions, as shown in FIG. 6. This could be accomplished with a process such as ALD which places a film of hard dielectric material, such as DLC or aluminum oxide ($Al_2O_3$), along the perimeter of the denuded region 25.

Moreover, any combination of back-fills may be used in different locations of the integrated circuit 2. Therefore, the integrated circuit 2 may be highly customized.

In step 714, a non-conformal top layer 27 is formed over the entire substrate. The non-conformal top layer 27 seals the denuded regions 25, protects the integrated circuit 2, and acts as the protective overcoat for the integrated circuit 2. Any suitable manufacturing process, such as PVD or CVD, may be used to form the non-conformal top layer 27. It is to be noted that if appropriate carrier gasses are used during the non-conformal CVD process then an inert gas back-fill of denuded regions 25 may be achieved.

It is within the scope of the invention to repeat step 704 one or more times before proceeding to optional step 706. This alternative process flow may be desirable in situations where the denuding sequence (steps 706–712) is performed more than once during wafer fabrication. This alternative process flow could also be used in situations where the most recent metal layer fabricated (i.e. 13) is not denuded but instead is used like a capping layer 23 (thus making step 706 optional/unnecessary) for the denuding of one or more lower metal levels (i.e. 12).

Furthermore, it is within the scope of the invention to repeat steps 708–714 multiple times. For example, a first set of IMD 19 regions are denuded, possibly back-filled, and then sealed (steps 708–714); then another set of IMD 19 regions are denuded, possibly back-filled with a different material/gas, and then sealed.

Moreover, it is within the scope of the invention to return to step 704 after the completion of step 714 if the processes involved in performing step 704 will not cause damage/fracture of the previously formed denuded structures (i.e. if the damascene copper formation is performed with spin-etch techniques or other low stress processes).

Now the fabrication of the semiconductor substrate continues with known manufacturing processes until the integrated circuit is complete and the device is packaged. For example, the next step would generally be creating the bond-pad openings with a pattern-and-etch technique. Then the bond pads (comprised of aluminum for example) would be formed (such as bond pad 42 in FIG. 11), the wafer diced, the wires placed, and the integrated circuit 2 finally packaged.

Additional modifications to the invention as described above are also within the scope of the claimed invention. As an example, instead of using dummy plugs 32 (as shown in FIG. 4) to support the structure of the PMD layer 10, the dummy plugs 32 may be used in any layer 12, 13, 22 to provide additional structural support.

As another example, selected regions of ILD 20 or etch-stop layers 18, 21, 30 may also be denuded if materials soluble in $scCO_2$ are used for those layers. Furthermore, instead of using different dielectric materials for the IMD 19 and ILD 20 layers in the dual damascene levels (13, 22), a single dielectric material may be used for both the IMD 19 and the ILD 20 in one or more of the dual damascene levels. Moreover, the composition of IMD, ILD and etch-stop materials may vary for each metal level 12, 13, 22.

Figure 12:
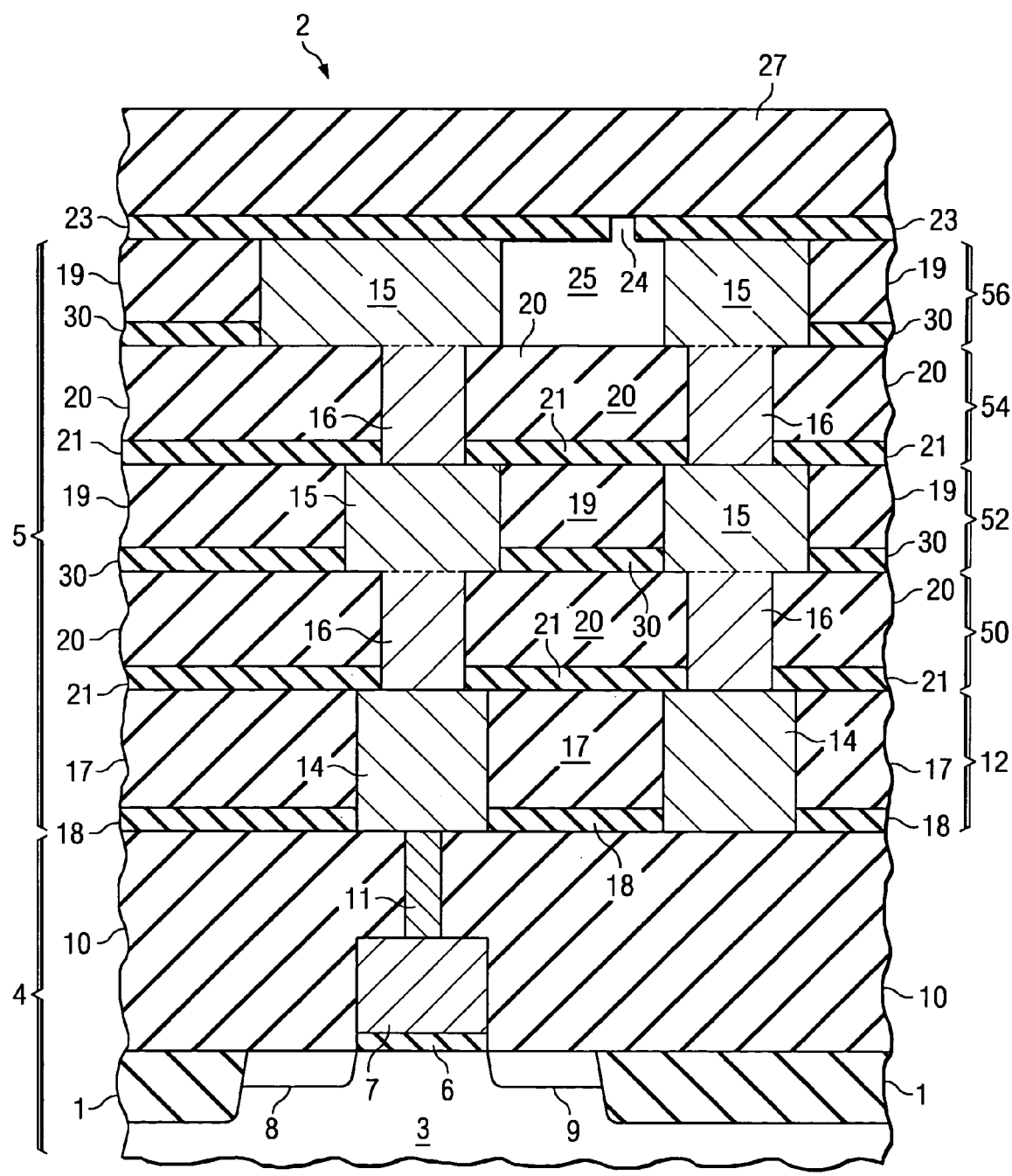
FIG. 12 is a cross-section view of an integrated circuit in accordance with a ninth embodiment of the present invention.

As shown in FIG. 12, another modification is an integrated circuit 2 having multiple single damascene layers 12, 50, 52, 54, 56. In the example configuration shown in FIG. 12, the first metal level 12 is single damascene; however all of the subsequent metal levels are also single damascene layers. More specifically, single damascene layers 50 and 54 contain the vias 16 and single damascene layers 52 and 56 contain the metal interconnects 15.

It is within the scope of the invention to use a single component SCF or a multi-component SCF for the denuding process. A multi-component SCF preferably comprises a solvent and one or more co-solvents. Moreover, the percentage of co-solvent(s) in the SCF mixture may be adjusted to effectively denude polar, non-polar, and/or ionic dielectric material.

In addition, the temperature and pressure for an ideal SCF process may vary. Specifically, the temperature and pressure may be adjusted as needed to maintain the characteristics of a supercritical fluid. Other considerations when adjusting temperature and pressure include SCF diffusivity and polarity. It should be noted that $scCO_2$ can be formed at temperatures above 31° C. and pressures above 1050 PSI.

Furthermore, the level of penetration and extraction that is achieved by any SCF process may be time-dependent. Longer treatment times generally result in deeper penetration of the SCF and greater extraction of dielectric material.

Moreover, the invention may be performed with a SCF other than $scCO_2$. For example, a SCF based on methanol may be used (at a temperature above the critical temperature of 239.4° C. and at a pressure above the critical pressure of 1174.2 psi). As another example, a SCF based on ammonia may be used (at a temperature above the critical temperature of 132.4° C. and at a pressure above the critical pressure of 1624.7 psi). The level at which the SCF is maintained above the critical temperature and critical pressure is determined by other factors of interest such as the target process time. Typically the higher the temperature and pressure (above what is needed to establish SCF) the lower the process time for a specific result. However, the maximum pressure would be around 10000 psi (which is the limit of the equipment) and the maximum temperature would be around 400° C. (to protect the physical structures of the integrated circuit).

The semiconductor substrate in the example application includes a semiconductor crystal, typically silicon. However, other semiconductors such as GaAs and InP may be used. In addition to a semiconductor crystal, the substrate 3 may include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc. Moreover, the invention is applicable to other semiconductor technologies such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing an integrated circuit comprising:
   forming a front-end structure over a semiconductor substrate;
   forming a back-end structure over said front-end structure, said back-end structure having a first metal level, said first metal level having metal interconnects and an inter-metal dielectric layer;
   forming a capping layer over said back-end structure;
   drilling an extraction line from said capping layer to said inter-metal dielectric layer;
   performing a supercritical fluid process to remove portions of said inter-metal dielectric layer that are coupled to said extraction line, thereby forming a denuded dielectric region; and
   forming a non-conformal top layer over said capping layer.

2. The method of claim 1 wherein said front-end structure has a pre-metal dielectric layer, said extraction line also extends from said inter-metal dielectric layer into said pre-metal dielectric layer, and said supercritical fluid process also removes portions of said pre-metal dielectric layer.

3. The method of claim 2 wherein said pre-metal dielectric layer is comprised of $SiO_2$.

4. The method of claim 2 wherein said back-end structure has at least one additional metal level that includes additional metal interconnects and an additional inter-metal dielectric layer, said extraction line also extends from said inter-metal dielectric layer into said additional inter-metal dielectric layer, and said supercritical fluid process also removes portions of said additional inter-metal dielectric layer.

5. The method of claim 2 wherein said pre-metal dielectric layer also has a bulkhead structure.

6. The method of claim 1 wherein said inter-metal dielectric layer is comprised of $SiO_2$.

7. The method of claim 1 wherein said first metal level also includes an inter-level dielectric layer comprised of carbon-doped oxide material.

8. The method of claim 1 further comprising a step of back-filling said denuded dielectric region before said step of forming a non-conformal top layer.

9. The method of claim 8 wherein said step of back-filling said denuded dielectric region includes depositing an ultra low-k dielectric material within said extraction line and said denuded dielectric region.

10. The method of claim 9 wherein said ultra low-k dielectric material is methylsilsesquioxane.

11. The method of claim 8 wherein said step of back-filling said denuded dielectric region includes substituting an inert gas within said extraction line and said denuded dielectric region.

12. The method of claim 11 wherein said inert gas is Ar.

13. The method of claim 11 wherein said inert gas is $N_2$.

14. The method of claim 8 wherein said step of back-filling said denuded dielectric region includes depositing a conformal bolster film within said extraction line and said denuded dielectric region.

15. The method of claim 14 wherein said conformal bolster film contains diamond-like carbon.

16. The method of claim 8 wherein said step of back-filling said denuded dielectric region includes depositing a conformal metal film that is coupled to said metal interconnects.

17. The method of claim 16 wherein said conformal metal film contains Ta.

18. The method of claim 1 wherein said back-end structure has at least one additional metal level that includes additional metal interconnects and an additional inter-metal dielectric layer, said extraction line also extends from said inter-metal dielectric layer into said additional inter-metal dielectric layer, and said supercritical fluid process also removes portions of said additional inter-metal dielectric layer.

19. The method of claim 1 wherein said supercritical fluid process is a supercritical $CO_2$ process.

20. The method of claim 1 wherein said first metal level also has a bulkhead structure.

21. A method of manufacturing an integrated circuit comprising:
   forming a front-end structure over a semiconductor substrate;
   forming a back-end structure over said front-end structure, said back-end structure having a first metal level, said first metal level having vias and an inter-level dielectric layer;
   forming a capping layer over said back-end structure;
   drilling an extraction line from said capping layer to said inter-level dielectric layer;

performing a supercritical fluid process to remove portions of said inter-level dielectric layer that are coupled to said extraction line, thereby forming a denuded dielectric region; and forming a non-conformal top layer over said capping layer.

22. The method of claim 21 wherein said front-end structure has a pre-metal dielectric layer, said extraction line also extends from said inter-level dielectric layer into said pre-metal dielectric layer, and said supercritical fluid process also removes portions of said pre-metal dielectric layer.

23. The method of claim 22 further comprising a step of back-filling said removed portions of said pre-metal dielectric layer before said step of forming a non-conformal top layer.

24. The method of claim 22 wherein said pre-metal dielectric layer also has a bulkhead structure.

25. The method of claim 21 further comprising a step of back-filling said denuded dielectric region before said step of forming a non-conformal top layer.

26. The method of claim 21 wherein said supercritical process is a supercritical $CO_2$ process.

27. The method of claim 21 wherein said first metal level also has a bulkhead structure.

* * * * *